United States Patent
Yerushalmi et al.

(10) Patent No.: US 11,971,664 B2
(45) Date of Patent: Apr. 30, 2024

(54) REDUCING DEVICE OVERLAY ERRORS

(71) Applicant: KLA-TENCOR CORPORATION, Milpitas, CA (US)

(72) Inventors: Liran Yerushalmi, Zicron Yaacob (IL); Roie Volkovich, Hadera (IL)

(73) Assignee: KLA-TENCOR CORPORATION, Milpitas, CA (US)

( * ) Notice: Subject to any disclaimer, the term of this patent is extended or adjusted under 35 U.S.C. 154(b) by 0 days.

(21) Appl. No.: 16/077,214

(22) PCT Filed: Jul. 30, 2018

(86) PCT No.: PCT/US2018/044453
§ 371 (c)(1),
(2) Date: Aug. 10, 2018

(87) PCT Pub. No.: WO2020/027784
PCT Pub. Date: Feb. 6, 2020

(65) Prior Publication Data
US 2020/0033737 A1    Jan. 30, 2020

(51) Int. Cl.
*G03F 7/00*     (2006.01)
*G01B 11/27*    (2006.01)
(Continued)

(52) U.S. Cl.
CPC ........ *G03F 7/70633* (2013.01); *G01B 11/272* (2013.01); *G03F 7/70683* (2013.01);
(Continued)

(58) Field of Classification Search
CPC ... G01B 11/272; G01B 2210/56; H01L 21/68; H01L 21/681; H01L 23/544;
(Continued)

(56) References Cited

U.S. PATENT DOCUMENTS 5,468,580 A * 11/1995 Tanaka .................... G03F 9/70
430/22
2003/0077527 A1    4/2003 Ausschnitt et al.
(Continued)

FOREIGN PATENT DOCUMENTS

WO    2014205274 A1    12/2014
WO    2016037003 A1    3/2016

OTHER PUBLICATIONS

ISA/KR, International Search Report and Written Opinion for PCT/US2018/044453 dated Apr. 30, 2019.
(Continued)

*Primary Examiner* — Christina A Riddle
(74) *Attorney, Agent, or Firm* — Hodgson Russ LLP

(57) ABSTRACT

Process control methods, metrology targets and production systems are provided for reducing or eliminating process overlay errors. Metrology targets have pair(s) of periodic structures with different segmentations, e.g., no segmentation in one periodic structure and device-like segmentation in the other periodic structure of the pair. Process control methods derive metrology measurements from the periodic structures at the previous layer directly following the production thereof, and prior to production of the periodic structures at the current layer, and use the derived measurements to adjust lithography stage(s) that is part of production of the current layer. Production system integrate lithography tool(s) and metrology tool(s) into a production feedback loop that enables layer-by-layer process adjustments.

11 Claims, 6 Drawing Sheets

(51) Int. Cl.
*H01L 21/68* (2006.01)
*H01L 23/544* (2006.01)

(52) U.S. Cl.
CPC ...... *G03F 7/706835* (2023.05); *H01L 21/681* (2013.01); *H01L 23/544* (2013.01); *G01B 2210/56* (2013.01); *H01L 2223/5442* (2013.01); *H01L 2223/54426* (2013.01)

(58) Field of Classification Search
CPC ..... H01L 2223/544; H01L 2223/54426; H01L 2223/54453; H01L 2223/5446; H01L 2223/544; G01N 21/9501; G01N 21/93; G01N 21/956; G03F 9/70; G03F 9/7003; G03F 9/7007; G03F 9/7069; G03F 9/7073; G03F 9/7076; G03F 9/708; G03F 9/7084; G03F 9/7088; G03F 9/7092; G03F 7/70616; G03F 7/70633; G03F 7/70675; G03F 7/70683; G03F 7/7055; G03F 7/70691; G03F 7/70716; G03F 7/70725; G03F 7/70775; G03F 7/70258; G03F 7/70991; G03F 7/705; G03F 7/706833; G03F 7/706835–706841; G03F 7/706843; G03F 7/706845
USPC ...................... 355/52–55, 67–71, 72, 75, 77; 356/399–401

See application file for complete search history.

(56) References Cited

U.S. PATENT DOCUMENTS

| | | | |
|---|---|---|---|
| 2004/0040003 A1* | 2/2004 | Seligson | G03F 7/705 438/16 |
| 2005/0193362 A1* | 9/2005 | Phan | G01N 21/95607 430/22 |
| 2007/0076205 A1 | 4/2007 | Schulz | |
| 2008/0002213 A1* | 1/2008 | Weiss | G03F 9/7084 356/620 |
| 2008/0286885 A1* | 11/2008 | Izikson | G03F 7/70625 438/7 |
| 2009/0186286 A1* | 7/2009 | Ausschnitt | G03F 7/70633 430/30 |
| 2010/0005442 A1* | 1/2010 | Ghinovker | G06F 30/39 716/55 |
| 2012/0244461 A1 | 9/2012 | Nagai | |
| 2014/0139815 A1 | 5/2014 | Amir | |
| 2015/0176985 A1 | 6/2015 | Shchegrov et al. | |
| 2016/0103946 A1* | 4/2016 | El Kodadi | G06F 30/392 716/51 |
| 2016/0131983 A1 | 5/2016 | Holovinger et al. | |
| 2016/0253450 A1* | 9/2016 | Kandel | H01L 22/30 356/401 |
| 2017/0307983 A1* | 10/2017 | Den Boef | G03F 7/70633 |
| 2018/0373167 A1* | 12/2018 | Grunzweig | G03F 7/70683 |
| 2020/0133135 A1* | 4/2020 | Feler | G01N 21/9501 |

OTHER PUBLICATIONS

EPO, Supplementary European Search Report for EP Application No. 18928545, dated Jan. 7, 2022.

* cited by examiner

REDUCING DEVICE OVERLAY ERRORS

BACKGROUND OF THE INVENTION

1. Technical Field

The present invention relates to the field of semiconductor metrology, and more particularly, to elimination or reduction of process overlay error.

2. Discussion of Related Art

As node size in semiconductors manufacturing decreases, the effect of process overlay errors becomes ever more significant.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a process control method utilizing a metrology target having periodic structures at least at a previous layer and at a current layer of a wafer in lithographic preparation, the process control method comprising: deriving metrology measurements from the periodic structures at the previous layer directly following the production thereof, and prior to production of the periodic structures at the current layer, and using the derived measurements to adjust at least a lithography stage that is part of production of the current layer.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1A:
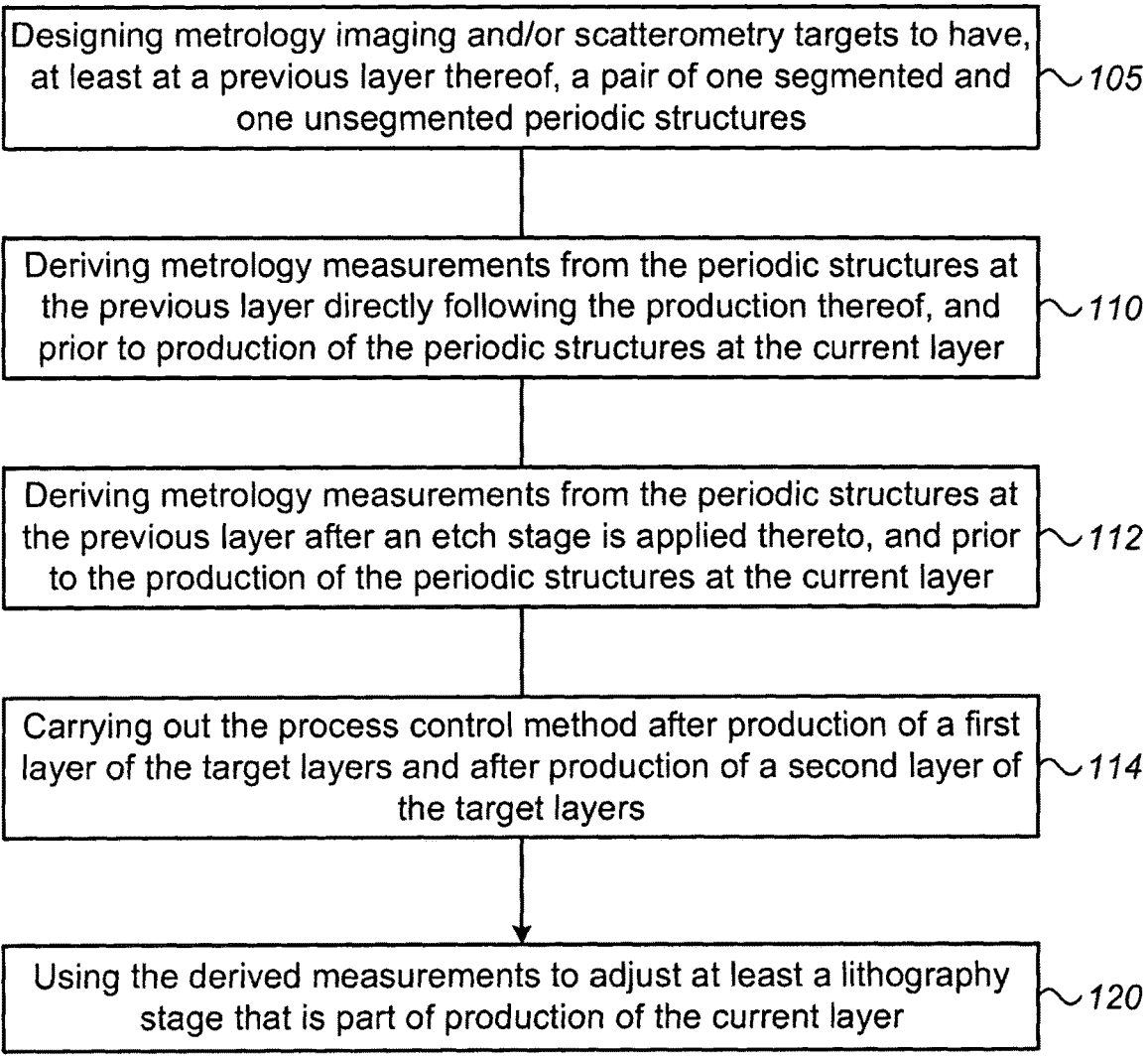
FIGS. 1A and 1B are high-level schematic block diagrams of a process control method, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices. In certain embodiments, illumination technology may comprise, electromagnetic radiation in the visual range, ultraviolet or even shorter wave radiation such as x rays, and possibly even particle beams.

Embodiments of the present invention provide efficient and economical methods and mechanism for improving (reducing) device overlays by eliminating or reducing the process overlay error, and thereby provide improvements to the technological field of semiconductor manufacturing, as well as metrology.

As semiconductor node size continues to shrink, disclosed embodiments reduce the variation of the overlay and improve the control of the process variation effecting the on-product overlay (OPO). Specifically, disclosed embodiments reduce or eliminate the variation in overlay that is related to incoming process which may cause shifts in overlay with dependency of feature sizes. In order to improve the control, disclosed embodiments establish measurements before specific lithography process stages and feedforward the measurements per wafer to improve the wafer specific overlay control in lithography tools such as the scanners. Below we disclosed concepts that enable such target design, measurement and control.

Process control methods, metrology targets and production systems are provided for reducing or eliminating process overlay errors. Metrology targets have pair(s) of periodic structures with different segmentations, e.g., no segmentation in one periodic structure and device-like segmentation in the other periodic structure of the pair. Process control methods derive metrology measurements from the periodic structures at the previous layer directly following the production thereof, and prior to production of the periodic structures at the current layer, and use the derived measurements to adjust lithography stage(s) that is part of production of the current layer. Production system integrate lithography tool(s) and metrology tool(s) into a production feedback loop that enables layer-by-layer process adjustments.

Figure 1B:
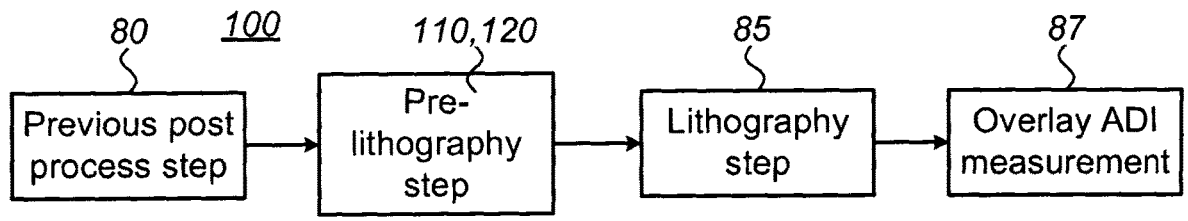

FIGS. 1A and 1B are high-level schematic block diagrams of a process control method 100, according to some embodiments of the invention. Process control method utilizes a metrology target 210 having periodic structures 214 at least at a previous layer 210A and at a current layer 210B of a wafer 90 in lithographic preparation (see targets illustrated in FIGS. 2A-2C and 3-5). The method stages may be carried out with respect to system 200 described below (see e.g., FIGS. 6A, 6B, 7A and 7B), which may optionally be configured to implement method 100. Method 100 may be at least partially implemented by at least one computer processor, e.g., in a control unit 240, a metrology module 230 or in a lithography module 220 (see FIGS. 6A, 6B, 7A and 7B). Certain embodiments comprise computer program products comprising a computer readable storage medium having computer readable program embodied therewith and configured to carry out the relevant stages of method 100. Certain embodiments comprise target design files of respective metrology targets 210 disclosed herein. Method 100 may comprise the following stages, irrespective of their order.

Method 100 may comprise, at a design stage, designing metrology imaging and/or scatterometry targets to have, at least at a previous layer thereof, a pair of one segmented and one unsegmented periodic structures (stage 105). It is noted that in certain embodiments, the segmented periodic structures may be segmented at device pitch, while the unsegmented periodic structures may be partly or fully segmented, but not at the device pitch, e.g., at a larger scale of magnitude which does not undergo similar process errors as the devices. In certain embodiments, the different periodic structures 214A, 214B may differ in their layout style, e.g., in one or more parameters of segmentation characteristics (e.g., pitch, CD—critical dimension, possibly patterns) and/or in one or more parameters of the periodic structure characteristics (e.g., pitch, CD—critical dimension, possibly patterns).

FIG. 1B illustrates schematically process control method 100 which includes measurement of the process overlay during the execution of the process, e.g., after a previous post process step 80, by adding pre-lithography overlay measurement (e.g., any of 110-114), and feedforwarding the measurement results 120 into the consecutive lithography step 85, e.g., to correct NZO (non-zero offset) in terms e.g., of a quality merit or an error bar. Consecutively, regular metrology measurements 87 such as After Develop Inspection (ADI) may be carried out. Intermediate measurement may be based on the difference in in overlay between the target layout before and after previous post process step 80, as exemplified below, to indicate and at least partly quantify the process effect on overlay.

Process control method 100 comprises deriving metrology measurements from the periodic structures at the previous layer directly following the production thereof, and prior to production of the periodic structures at the current layer (stage 110), and using the derived measurements to adjust at least a lithography stage that is part of production of the current layer (stage 120).

For example, the derived metrology measurements may comprise at least an overlay measurement with respect to two different periodic structures in the previous layer (see examples below). In particular, the two different periodic structures may be differently segmented, e.g., one periodic structure may be segmented at device pitch (see below, periodic structures 214A) while another periodic structure may be unsegmented (see below, periodic structures 214B). As the process overlay error is dominated by structure size and fine segmentation, the shift in overlay between the two aligned structures may be characterized and the process overlay error may be calculated and possibly corrected or reduced even before metrology target 210 is produced completely (see FIG. 1B).

Process control method 100 may further comprise deriving metrology measurements from the periodic structures at the previous layer after an etch stage is applied thereto, and prior to the production of the periodic structures at the current layer (stage 112). The derived metrology measurements may comprise at least an overlay measurement with respect to the periodic structure in the previous layer, before and after the etch stage.

In certain embodiments, metrology target 210 may comprise an imaging target, comprising two, three, or more layers. For example, imaging target 210 may comprise at least three layers (210A, 210B, 210C, see, e.g., FIGS. 3 and 4) of wafer 90, and process control method 100 may be carried out after production of a first layer of the three layers and after production of a second layer of the three layers (stage 114).

In certain embodiments, metrology target 210 may comprise a scatterometry target, comprising at least two grating-over-grating targets (210D, 210E, see FIGS. 2C, 5, 7A and 7B), having their previous layers 210A produced side-by-side on wafer 90 for the metrology measurements derivation.

It is noted that elements from multiple of the following figures may be combined in any operable combination, and the illustration of certain elements in certain figures and not in others merely serves an explanatory purpose and is non-limiting.

Figure 2A:
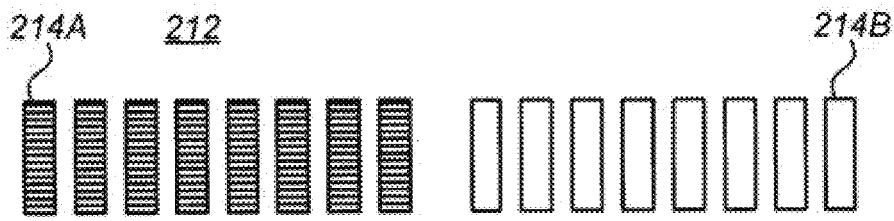
FIGS. 2A-2C are high level schematic illustrations of design principles applicable to metrology targets, according to some embodiments of the invention.
Figure 2B:
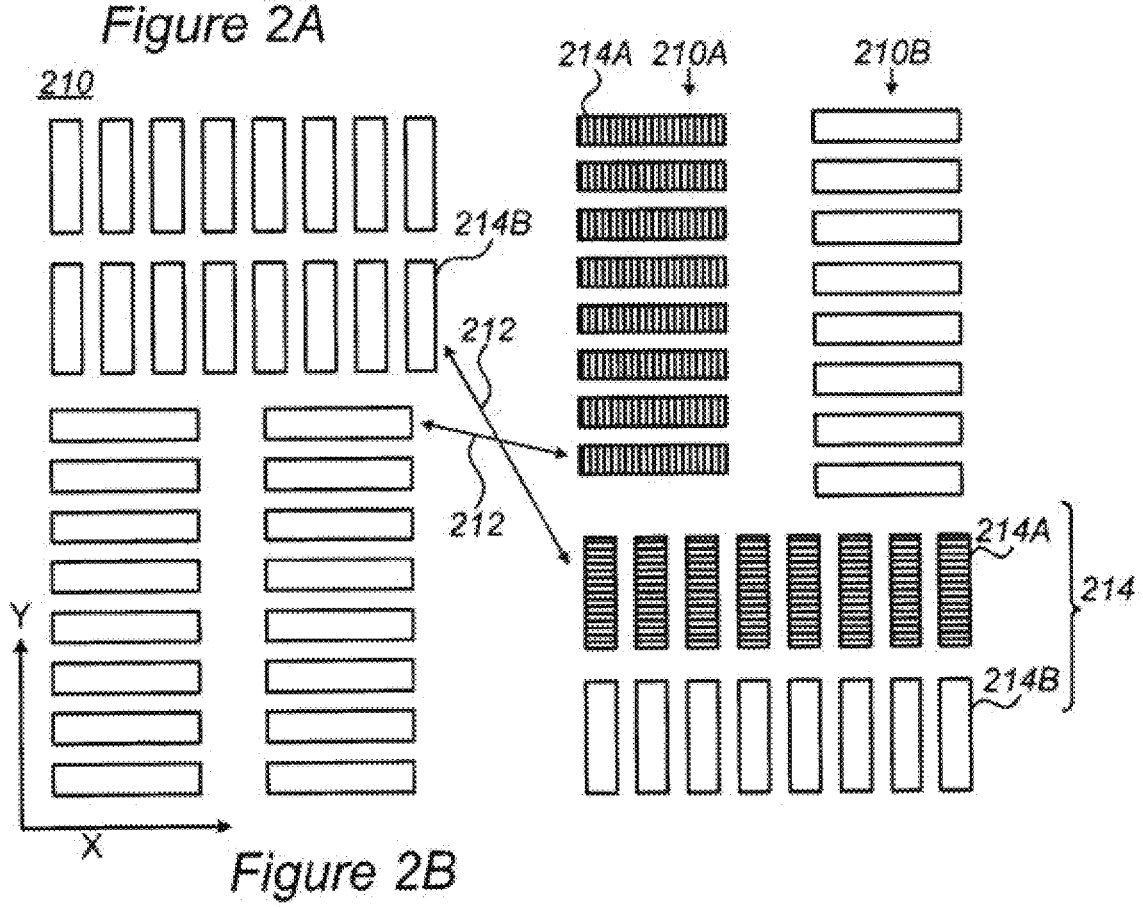
Figure 2C:
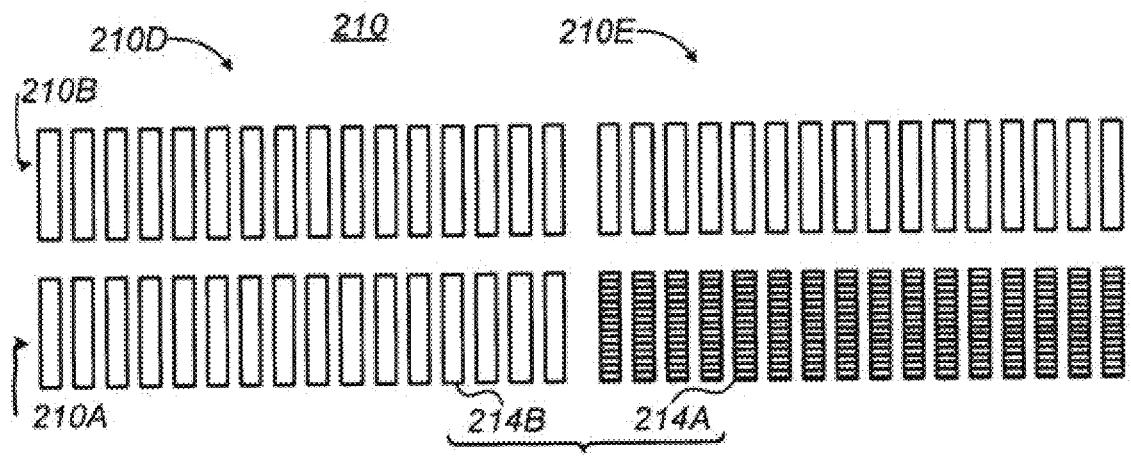

FIGS. 2A-2C are high level schematic illustrations of design principles applicable to metrology targets 210, according to some embodiments of the invention. Metrology targets 210 comprise at least two pairs 212 of periodic structures 214, at least one pair at previous layer 210A and at least another pair in current layer 210C. In each pair 212, one periodic structure 214A is segmented with device-like segmentation and other periodic structure 214B is unsegmented. Metrology targets 210 may comprise imaging targets having two or three pairs of periodic structures in each of two measurement directions (see e.g., FIGS. 3 and 4). Metrology targets 210 may comprise scatterometry targets, with two side-by-side grating-over-grating periodic structures, along at least one measurement direction (see e.g., FIGS. 2C, 5, 7A and 7B).

FIG. 2A illustrates schematically pair 212 of segmented and unsegmented periodic structures 214A, 214B, respectively, with segmentation of periodic structure 214A possibly being with device-like segmentation. Pair 212 may be used as independent metrology target 210 and/or as element (s) in more complex metrology targets 210. FIG. 2B illustrates schematically simplified imaging metrology target 210, having pairs 212 in two measurement directions (denoted X and Y) in previous layer 210A and regular periodic structures, similar within each pair (e.g., segmented or unsegmented)—in current layer 210B. Imaging metrology target 210 may comprise more than two pairs 212 of periodic structures 214 in each of two measurement directions (X, Y), e.g., Imaging metrology target 210 may further comprise two pairs 212 in previous layer 210A in each measurement direction, configured to enable measurement of the produced structures before and after the etching stage (see, e.g., FIGS. 3 and 4). FIG. 2C illustrates schematically simplified scatterometry metrology target 210, having two side-by-side grating-over-grating periodic structures 210D, 210E, along at least one measurement direction. Gratings (periodic structures) of targets 210D, 210E at previous layer 210B may be segmented differently (e.g., segmented periodic structures 214A having the device pitch and unsegmented periodic structure 214B which is not segmented or segmented at a larger pitch than the device pitch).

Target design files and metrology measurements of disclosed metrology target 210 are likewise part of the present disclosure. It is noted that disclosed metrology targets 210 are described in FIGS. 2A-C in a non-limiting manner as mask patterns, and actual printed targets may differ from the mask design due to OPC (optical proximity correction) modifications and process characteristics, including process errors which are measured by disclosed methods 200.

Figure 3:
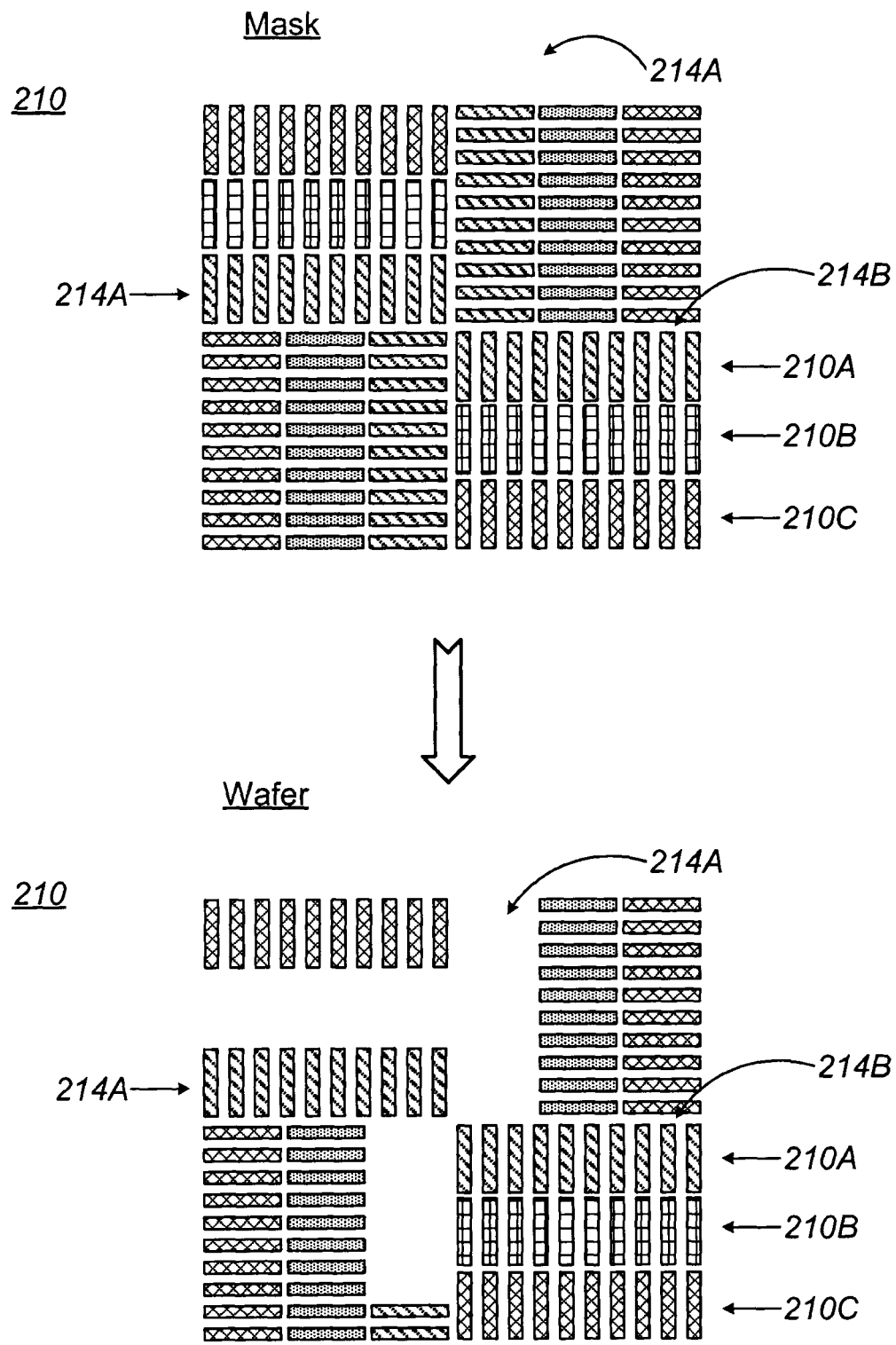
FIGS. 3 and 4 are high level schematic illustrations of metrology target after production, in relation to disclosed measurement method, according to some embodiments of the invention.
Figure 4:
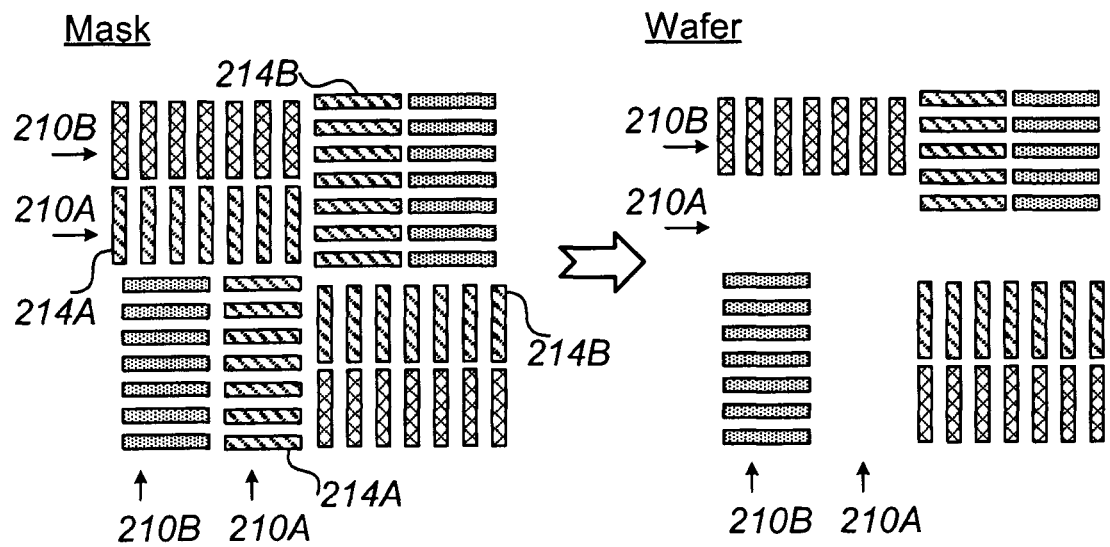

FIGS. 3 and 4 are high level schematic illustrations of metrology target 210 after production, in relation to disclosed measurement method 100, according to some embodiments of the invention. In a non-limiting example, metrology target 210 comprises a TAIM (triple AIM—advanced imaging metrology) target having three sets of periodic structures—previous layer 210A, previous layer after etching 210B and current layer (e.g., resist) 210C. In each layer, pairs of periodic structure in each measurement direction (e.g., X and Y, corresponding to scanner axes) are used to derive the corresponding overlay measurements. It is noted that multiple illumination and collection schemes may be used in order to improve accuracy and performance. The relatively big target pitch is required in order to have enough information for the imaging signal analysis. While the overlay may be calculated in the conventional method, the imaging overlay of the previous layer structures may be calculated used a modified algorithm, designed according to disclosed target structures such as different periodic structures in pairs 212.

As illustrated schematically in FIGS. 3 and 4, parts or while periodic structures may not be printed, or etched away, due to process errors. The different production of corresponding segmented and unsegmented periodic structures 214A, 214B, respectively, may be used to indicate the process errors involved and enable at least partial correction thereof even before current layer 210B is printed.

Figure 5:
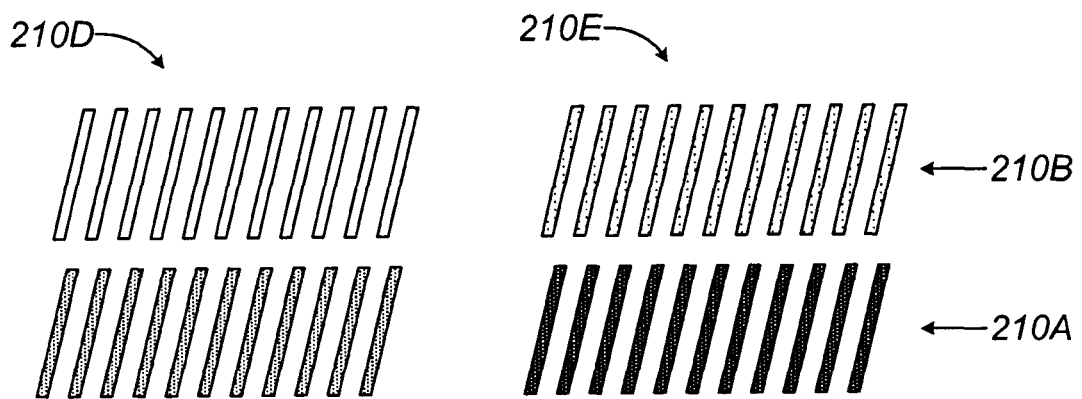
FIG. 5 is a high level schematic illustration of metrology scatterometry targets, designed to be printed side-by-side to employ process control method, according to some embodiments of the invention.

FIG. 5 is a high level schematic illustration of metrology scatterometry targets 210D, 210E, designed to be printed side-by-side to employ process control method 100, according to some embodiments of the invention. Metrology scatterometry targets 210D, 210E may be configured to share periodic structures in at least one layer 210A, such as a previous layer, from which process errors may be derived by measurements of differently segmented periodic structures (see also FIGS. 2C, 7A and 7B). In certain embodiments, the correlation between the imaging overlay results and scatterometry overlay results may be used as a quality merit for the NZO (non-zero offset) and/or error bar estimation.

FIGS. 6A, 6B, 7A and 7B are high level schematic illustrations of a production system 250, according to some embodiments of the invention. Production system 250 comprises at least one lithography tool 220 configured to prepare wafer 90 by producing layers thereof, metrology tool(s) 230 configured to derive metrology measurements from periodic structures 214 at previous layer 210A of metrology target 210, directly following the production of the previous layer periodic structures, and prior to production of periodic structures 214 at current layer 210C of metrology target 210, and control unit 240 (which may be independent, part of lithography tool(s) 220) and/or part of metrology tool(s) 230) configured to use the derived measurements to adjust lithography tool(s) 220 with respect to at least a lithography stage that is part of production of current layer 210C of metrology target 210.

Metrology targets 210 may comprise at least two pairs 212 of periodic structures 214, at least one pair 212 at previous layer 210A and at least another pair 212 in current layer 210B, wherein in each pair 212, one periodic structure is segmented with device-like segmentation and the other periodic structure is unsegmented.

Figure 6A:
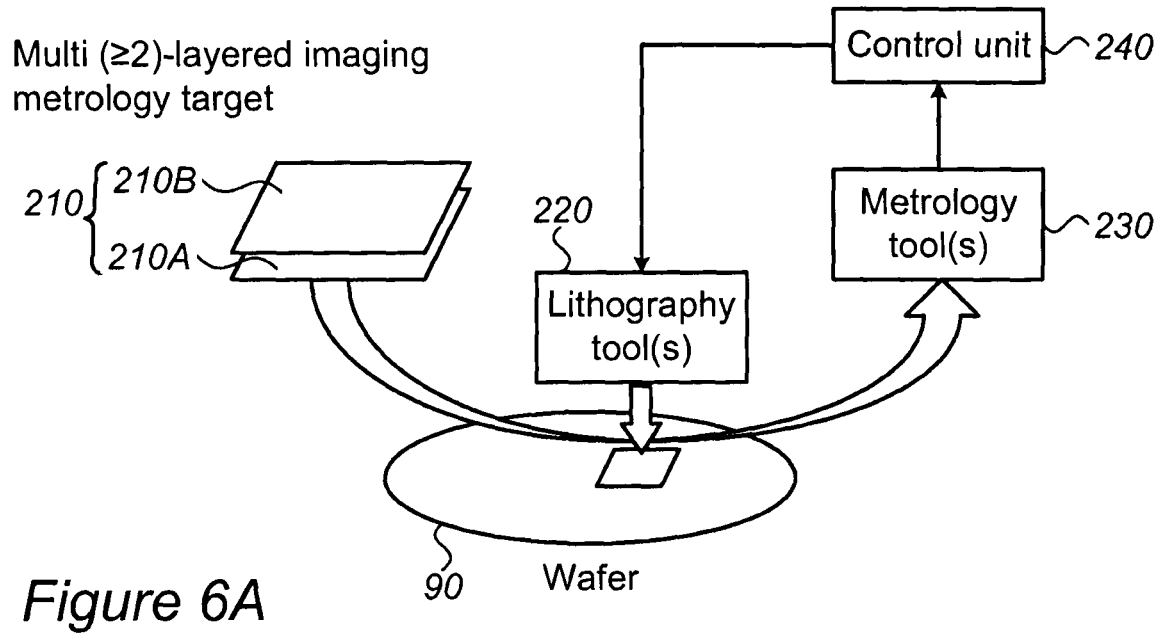
FIGS. 6A, 6B, 7A and 7B are high level schematic illustrations of a production system, according to some embodiments of the invention.
Figure 6B:
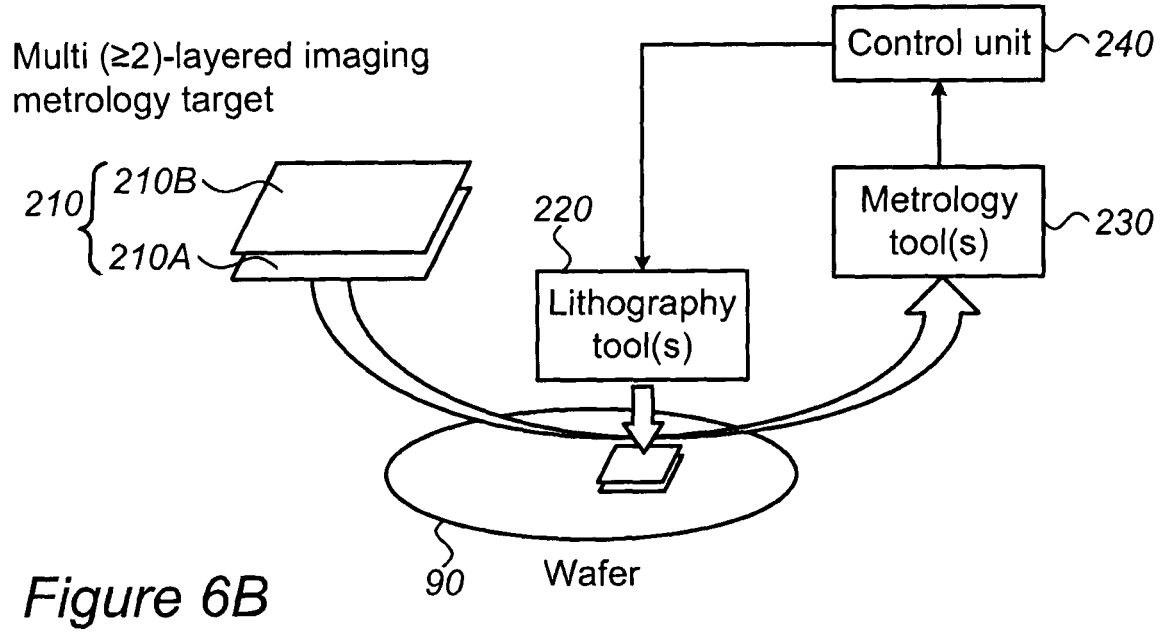

For example, FIGS. 6A and 6B illustrate, respectively, imaging target 210 being produced, layer by layer, by lithography tool 220, with metrology tool 230 providing measurement results after production of previous (first) layer 210A, as illustrated schematically in FIG. 6A, which may be used to adjust production parameters of consecutive current (second) layer 210B by lithography tool, as illustrated schematically in FIG. 6B. It is noted that imaging target 210 may comprise more than two layers with corresponding adjustments of measurement and production adjustment procedures.

Figure 7A:
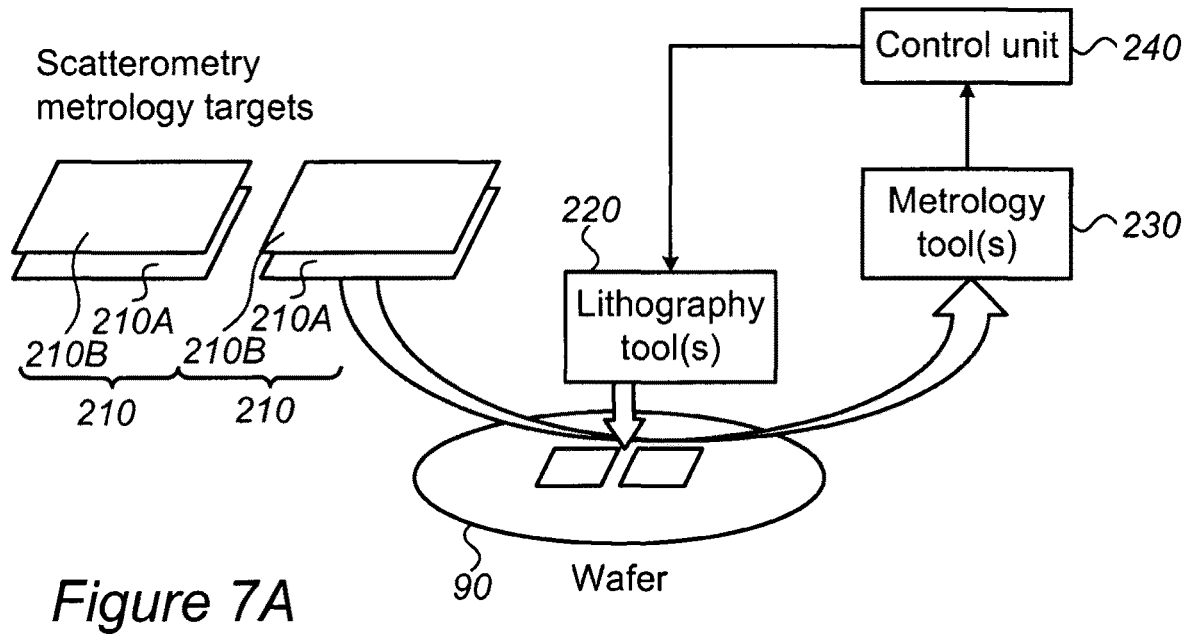
Figure 7B:
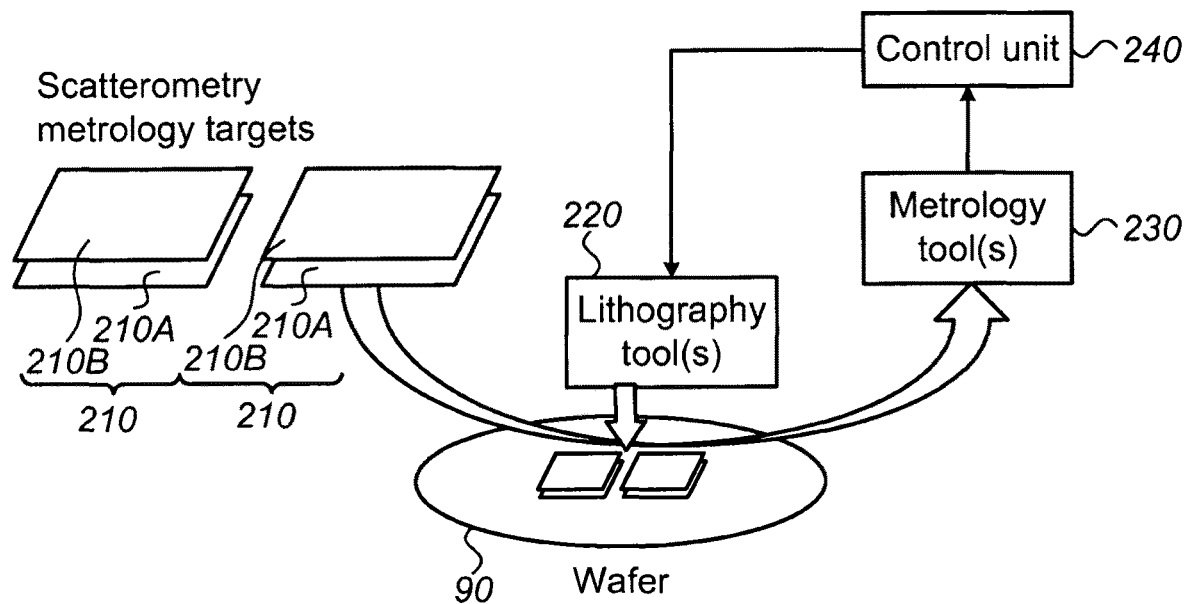

In another example, FIGS. 7A and 7B illustrate, respectively, scatterometry targets 210 being produced, layer by layer, by lithography tool 220, with metrology tool 230 providing measurement results after production of previous (first) layer 210A, as illustrated schematically in FIG. 7A, which may be used to adjust production parameters of consecutive current (second) layer 210B by lithography tool, as illustrated schematically in FIG. 7B. It is noted that scatterometry target 210 may comprise more than two layers with corresponding adjustments of measurement and production adjustment procedures. Two scatterometry targets 210 may be produced side by side to provide sufficient periodic structures in at least previous layer 210A to implement the disclosed procedures.

Advantageously, disclosed procedures overcome shortcomings of conventional metrology methods based on post-lithography measurement of the structures' overlay. While prior art methods provide only feed-backward overlay control which is due to wafer to wafer variation, resulting in poor ability to control the process window, disclosed embodiments enable to represent different populations of device structures within a device, accurately reflect the status of the actual device features in the die and therefore enable operation under tighter overlay budgets and on-product overlay (OPO). While prior art methods are limited in their ability to reflect accurately the status of the actual device features in the die (due to differences in process loading, pattern density or aberration fields, because metrology measurement are not done on similar structures and at similar locations), disclosed embodiments may be used in a structure-specific manner to provide spatially-differentiated overlay measurements. The disclosed ability to adjust the lithography process during production also reduces the overall errors and enhance accuracy and precision of both production and metrology procedures.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A process control method utilizing a metrology target on a wafer in lithographic preparation, the metrology target comprising a previous layer that includes periodic structures, the process control method comprising:
   deriving metrology measurements from the periodic structures at the previous layer directly following production thereof and prior to production of a current layer that includes periodic structures,
   deriving metrology measurements from the periodic structures at the previous layer after an etch stage is applied thereto, and prior to the production of the periodic structures at the current layer, wherein at least some of the periodic structures in the current layer are directly over the periodic structures in the previous layer in a grating-over-grating arrangement, wherein the metrology measurements from before and after the etch stage are used to generate derived metrology measurements, and wherein at least part of the periodic structures at the previous layer are not printed or are etched away due to process errors, and
   using the derived metrology measurements from only the previous layer to adjust at least a lithography stage that is part of production of the current layer, wherein the periodic structures at the previous layer directly following production, the periodic structures at the previous layer after the etch stage, and the periodic structures at the current layer each include pairs of the periodic structures that are aligned end-to-end in a same measurement direction, and wherein in each of the pair at the previous layer and the pair in the current layer, one periodic structure is segmented with device-like segmentation and the other periodic structure is unsegmented.

2. The process control method of claim 1, wherein the derived metrology measurements comprise at least an overlay measurement with respect to two different periodic structures of the previous layer.

3. The process control method of claim 1, wherein the derived metrology measurements comprise at least an overlay measurement with respect to the periodic structures at the previous layer.

4. The process control method of claim 1, wherein the metrology target is an imaging target.

5. The process control method of claim 4, wherein the imaging target comprises at least three layers of the wafer, and the process control method is carried out after production of a first layer of the three layers and after production of a second layer of the three layers.

6. The process control method of claim 1, wherein the metrology target is a scatterometry target.

7. The process control method of claim 6, wherein the scatterometry target comprises at least two grating-over-grating targets having their previous layers produced side-by-side on the wafer for the generating of the derived metrology measurements.

8. The process control method of claim 1, wherein the periodic structures at the previous layer after the etch stage and the periodic structures at the current layer are arranged in two perpendicular measurement directions.

9. The process control method of claim 1, wherein the periodic structures at the previous layer after the etch stage and the periodic structures at the current layer differ in pitch or critical dimension.

10. A production system comprising:
    at least one lithography tool configured to prepare a wafer by producing layers thereof,
    a metrology tool configured to derive metrology measurements from periodic structures at a previous layer of a metrology target, directly following production of the previous layer and after an etch stage is applied thereto, and prior to production of periodic structures at the current layer of the metrology target, thereby generating derived metrology measurements using the metrology measurements from before and after the etch stage, wherein at least some of the periodic structures in the current layer are directly over the periodic structures in the previous layer in a grating-over-grating arrangement, and wherein at least part of the periodic structures at the previous layer are not printed or are etched away due to process errors, and
    a control unit configured to use the derived metrology measurements from only the previous layer to adjust the at least one lithography tool with respect to at least a lithography stage that is part of production of the current layer of the metrology target, wherein the periodic structures at the previous layer directly following production, the periodic structures at the previous layer after the etch stage, and the periodic structures at the current layer each include pairs of the periodic structures that are aligned end-to-end in a same measurement direction, and wherein in each of the pair at the previous layer and the pair in the current layer, one periodic structure is segmented with device-like segmentation and another periodic structure is unsegmented.

11. The production system of claim 10, wherein the control unit is independent, part of the at least one lithography tool, and/or part of the metrology tool.

* * * * *